United States Patent
Murtojärvi et al.

(10) Patent No.: US 6,393,260 B1
(45) Date of Patent: May 21, 2002

(54) METHOD FOR ATTENUATING SPURIOUS SIGNALS AND RECEIVER

(75) Inventors: Simo Murtojärvi, Salo; Antti Rauhala, Muurla; Harri Kimppa, Salo, all of (FI)

(73) Assignee: Nokia Mobile Phones Limited, Espoo (FI)

(*) Notice: Subject to any disclaimer, the term of this patent is extended or adjusted under 35 U.S.C. 154(b) by 0 days.

(21) Appl. No.: 09/292,301

(22) Filed: Apr. 15, 1999

(30) Foreign Application Priority Data

Apr. 17, 1998 (FI) ............................................. 980858 U

(51) Int. Cl.⁷ .............................................. H04B 1/02
(52) U.S. Cl. ......................... 455/91; 455/323; 455/333; 455/343; 455/305
(58) Field of Search ......................... 455/91, 318, 323, 455/333, 326, 317; 327/355, 357, 359, 296, 305, 343, 77, 193.1

(56) References Cited

U.S. PATENT DOCUMENTS

| | | | | |
|---|---|---|---|---|
| 4,194,158 A | * | 3/1980 | Tanabe et al. | 455/333 |
| 4,928,314 A | * | 5/1990 | Grandfield et al. | 455/236.1 |
| 5,001,372 A | | 3/1991 | Nyqvist | 307/529 |
| 5,379,458 A | | 1/1995 | Vaisanen | 455/330 |
| 5,390,345 A | | 2/1995 | Wada et al. | 455/234.1 |
| 5,430,895 A | | 7/1995 | Huusko | 455/327 |
| 5,584,066 A | | 12/1996 | Okanobu | 455/302 |
| 5,630,228 A | | 5/1997 | Mittel | 455/326 |
| 5,825,231 A | * | 10/1998 | Chevallier et al. | 327/356 |
| 5,831,303 A | | 11/1998 | Rapeli | 257/316 |
| 5,886,547 A | * | 3/1999 | Durec et al. | 327/113 |
| 6,138,000 A | * | 10/2000 | Navid et al. | 455/326 |

FOREIGN PATENT DOCUMENTS

| | | |
|---|---|---|
| WO | WO 95/30275 | 11/1995 |
| WO | WO 97/07596 | 2/1997 |
| WO | WO 98/47221 | 10/1998 |

OTHER PUBLICATIONS

Patent Abstracts of Japan JP 08056121.
"A 170 MHz RF Front–End for ERMES Pager Applications" Piazza et al., IEEE Journal of Solid–State Circuits, vol. 30, No. 12, pp. 1430–1437.
Finnish Search Report.

* cited by examiner

Primary Examiner—Dwayne Bost
Assistant Examiner—Lewis West
(74) Attorney, Agent, or Firm—Perman & Green, LLP

(57) ABSTRACT

The invention relates to a method and radio receiver for attenuating spurious signals when receiving (6 to 12) radio signals, when radio signals are mixed (10) to a second frequency, which may be the baseband frequency, for example. Spurious signals are caused by balance errors in the mixer (10) which result from component value fluctuations within tolerance limits. According to the invention, mixing is balanced by setting (12) variable-level bias voltages and/or currents to transistors in the mixer circuit (10). An advantage of the invention is that even-order spurious signals caused by balance errors in the mixing of a signal to a second frequency are considerably attenuated. The invention finds particular utility in a mobile communications device, for example.

11 Claims, 6 Drawing Sheets

METHOD FOR ATTENUATING SPURIOUS SIGNALS AND RECEIVER

CROSS-REFERENCES TO RELATED APPLICATIONS

Figure 1:
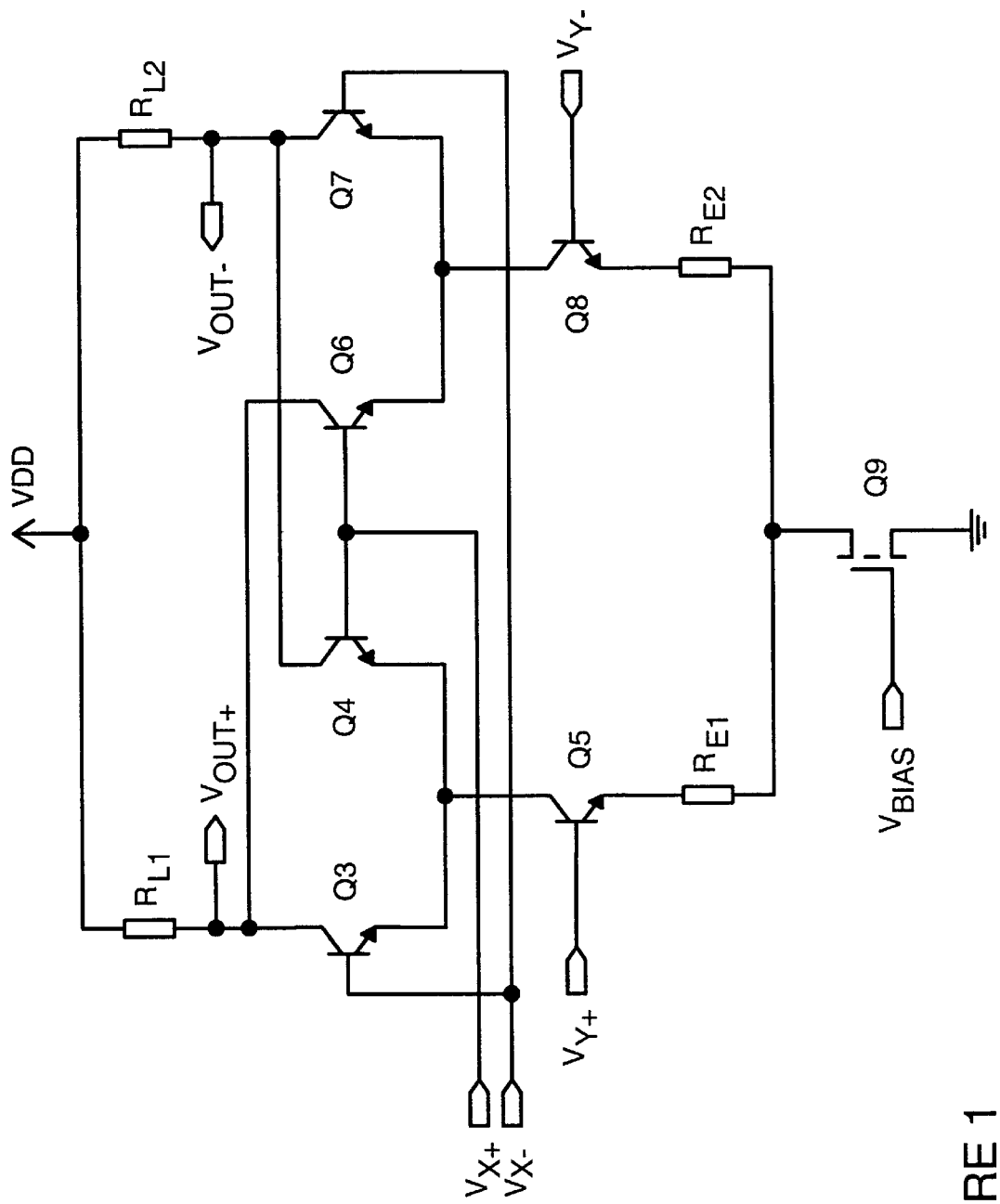

The invention relates to a method for attenuating spurious signals in a transmitter and/or receiver in which radio signals are mixed to a second frequency, e.g. to an intermediate frequency (IF) or, in the case of so-called direct conversion, straight to the baseband, i.e. 0-Hz IF, and in addition the invention relates to a receiver. The invention thus pertains to a method defined in the preamble of claim 1 and a receiver defined in the preamble of claim 7.

DESCRIPTION OF THE RELATED ART INCLUDING INFORMATION DISCLOSED UNDER 37 CFR 1.97 AND 1.98

When aiming at good linearity in radio reception, the biggest problem is usually the mixing of the received signal. Mixing is used for converting a high-frequency received signal down to a lower intermediate frequency. Attempts are made to attenuate in different ways the mixing results of even and odd orders which are brought about in the mixing in addition to the desired result. The mixing results of even orders are canceled by means of balanced or double-balanced mixer constructions. In the ideal situation, the even mixing results of two branches of a mixer cancel each other as being opposite. In practice, the attenuation caused by canceling is sufficient when the intermediate frequency is right and frequency-selective filtering is used. Then the frequencies causing the second order are attenuated already before the mixer down to a level where not too many of those frequencies will be generated in the mixer. However, there are receivers in which it is advantageous to use an intermediate frequency that might temporarily have a second-order spurious signal. Such a receiver is found e.g. in a multiple-frequency transceiver using one intermediate frequency and a common local oscillator.

Spurious responses will also be generated in a direct-conversion receiver, the worst being modulation-frequency interference at the receiver's mixer output caused by a strong amplitude-modulated (AM) signal of another transceiver. This will appear even if the frequency of the interfering signal considerably deviated from the receiving frequency. These interferences are mainly caused by the second-order distortion component which contains a variable-level DC component proportional to the amplitude of the interference-causing signal. The variable-amplitude signal produces at the mixer output a signal which comprises a variable DC component and the frequency of which is identical with the varying of the amplitude. This signal is attenuated in accordance with the mixer's balance accuracy and linearity. Sufficient attenuation can be achieved e.g. by using a mixer that has a good signal amplitude tolerance. In this way even spurious signals of a large amplitude will not cause a considerable interfering signal at the mixer output.

From the prior art it is known a so-called Gilbert cell which is widely used in integrated multiplier circuits of communications systems, especially in mobile communication devices. Multiplier circuits are used in integrated IF parts such as mixers and variable gain amplifiers.

A mixer can be based on a Gilbert cell. Such a mixer has to use large currents, high operating voltages and high local oscillator level to achieve a small relative portion of interfering signal and small effect on the mixer operating points. Additionally, the balance of the incoming RF signal, balance of the amplification of the different branches of the mixer, and the balance of the local oscillator are of great importance to the attenuation of spurious signals of even orders. The low voltage used nowadays because of the tendency to reduce power consumption causes that not all mixer types provide sufficient attenuation of spurious signals. Tolerances of the components used in the mixers are too wide to achieve a balance good enough at low voltages.

It is a problem with known radio receivers that single unbalanced mixers produce, in addition to the desired mixing result, spurious signals of both even and odd orders.

It is another problem with known radio receivers that spurious signals of even orders, which are generated in balanced mixers in addition to the desired mixing result, are insufficiently attenuated at low voltages.

It is an object of the invention to improve the attenuation of spurious signals of even orders so that an adequate end result will be achieved even with low operating voltages and smaller currents.

BRIEF SUMMARY OF THE INVENTION

The method according to the invention is characterized by what is expressed in claim 1. The receiver according to the invention is characterized by what is expressed in claim 7. Preferred embodiments of the invention are described in the dependent claims.

The invention pertains to a method for attenuating spurious signals in a transmitter and/or receiver in which radio signals are mixed to a second frequency which may also be the baseband frequency. In accordance with the invention, mixing is balanced by adjusting transistor bias voltages and/or currents in the mixer circuit.

The invention also pertains to a receiver that comprises a mixer for mixing radio signals to a second frequency, which may also be the baseband frequency, and means for attenuating spurious signals while receiving radio signals. In accordance with the invention, it comprises balance-adjusting means of mixer circuit to adjust the balance of the circuit by adjusting transistor bias voltages and/or currents in the mixer circuit.

It is an advantage of the invention that in the mixing to a second frequency spurious signals of even orders caused by balance errors resulting from component tolerances considerably attenuated.

BRIEF DESCRIPTION OF THE SEVERAL VIEWS OF THE DRAWING(S)

Figure 2:
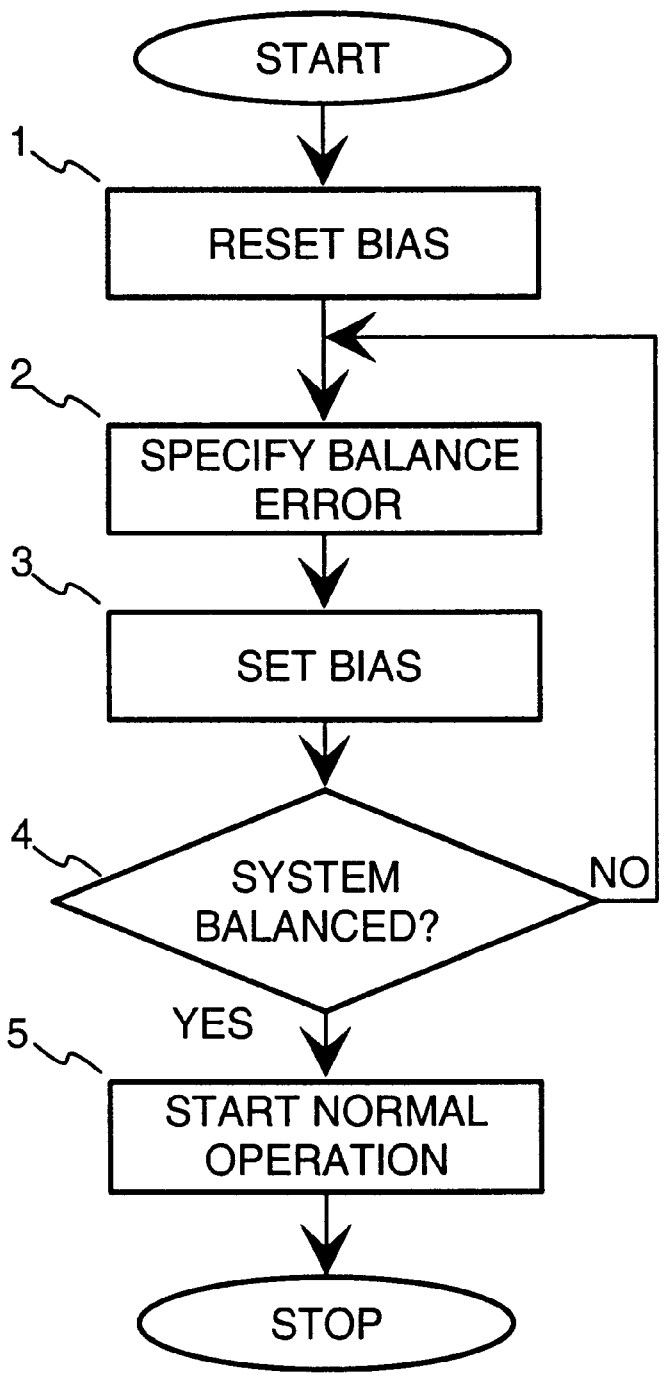
Figure 3:
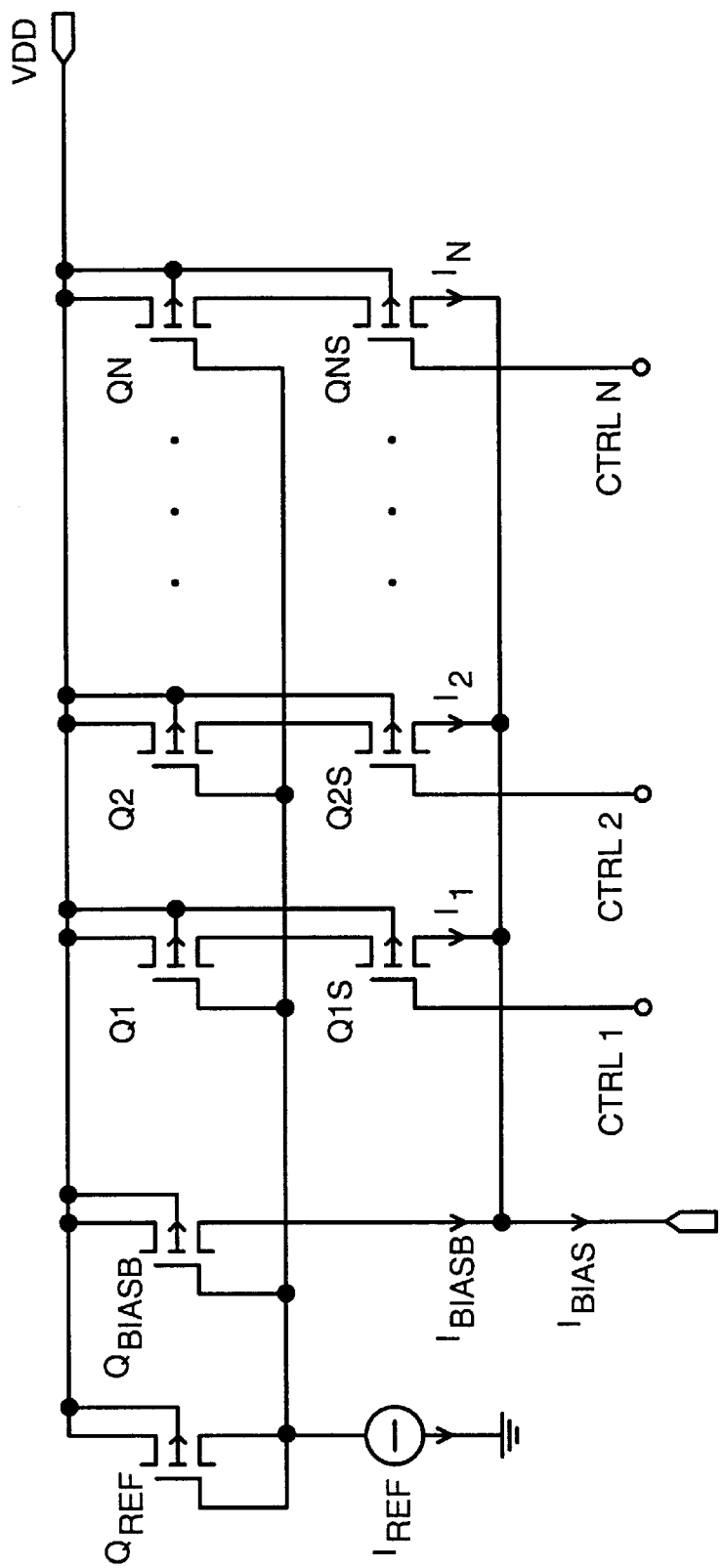
Figure 4:
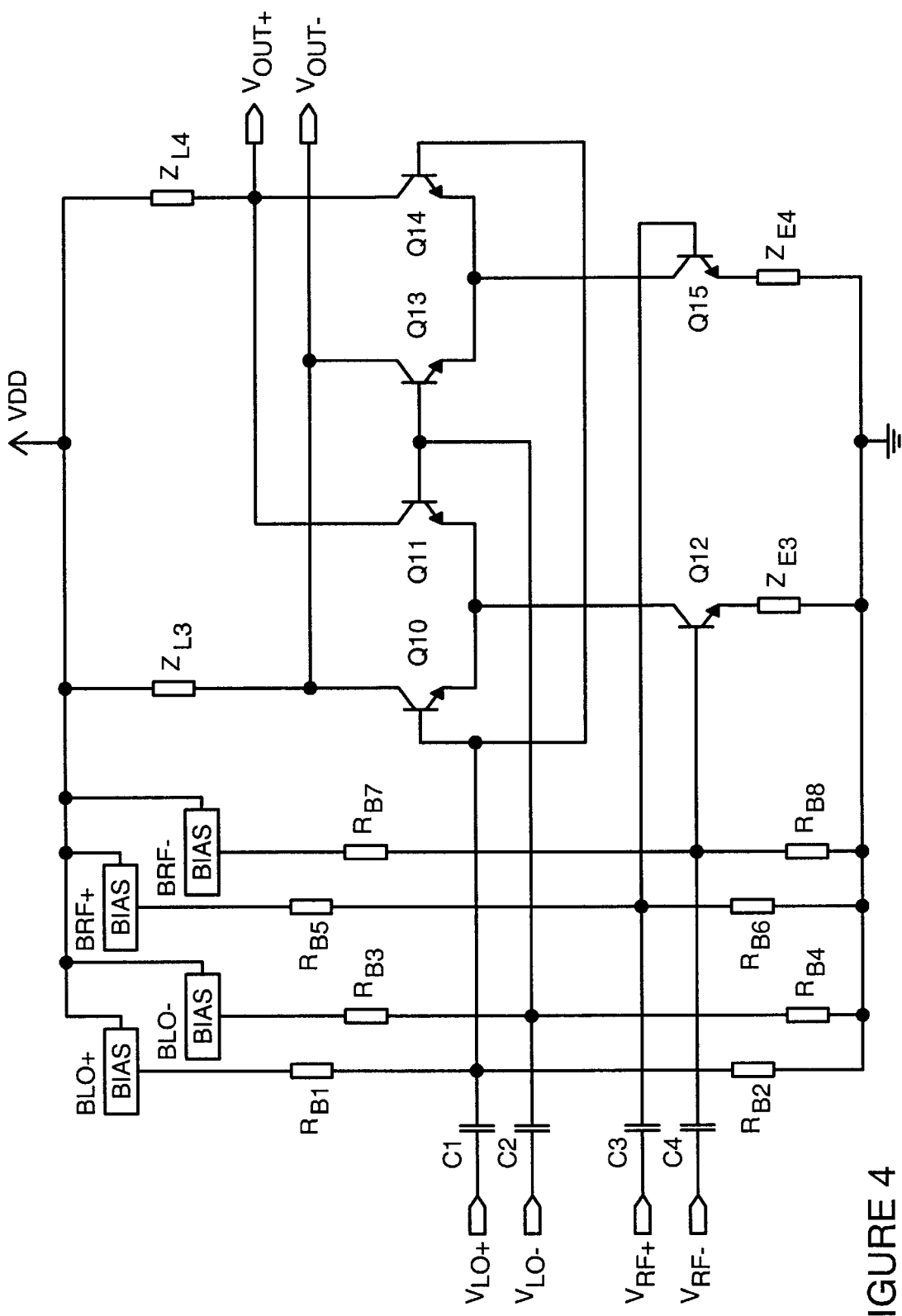
Figure 5:
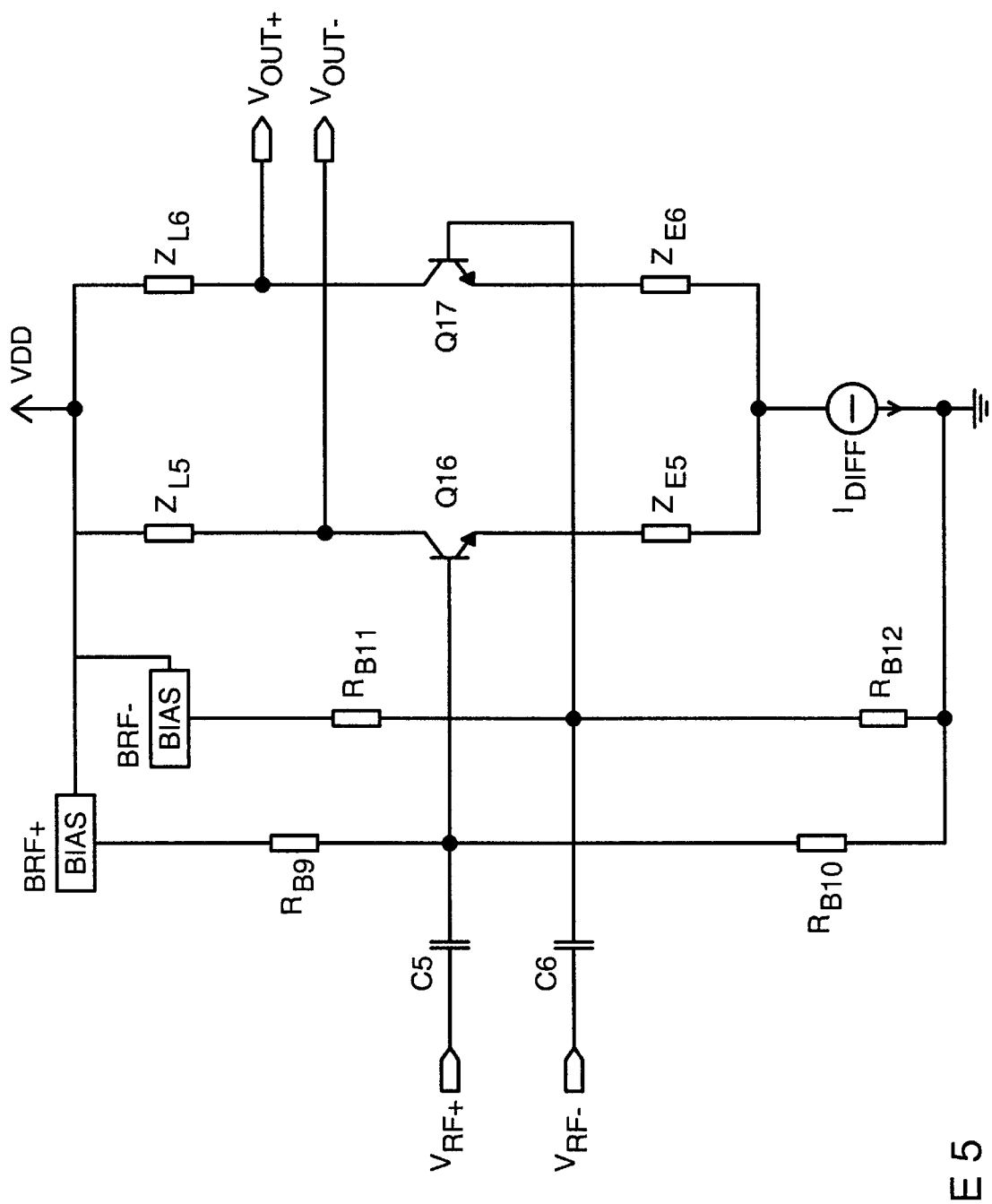
Figure 6:
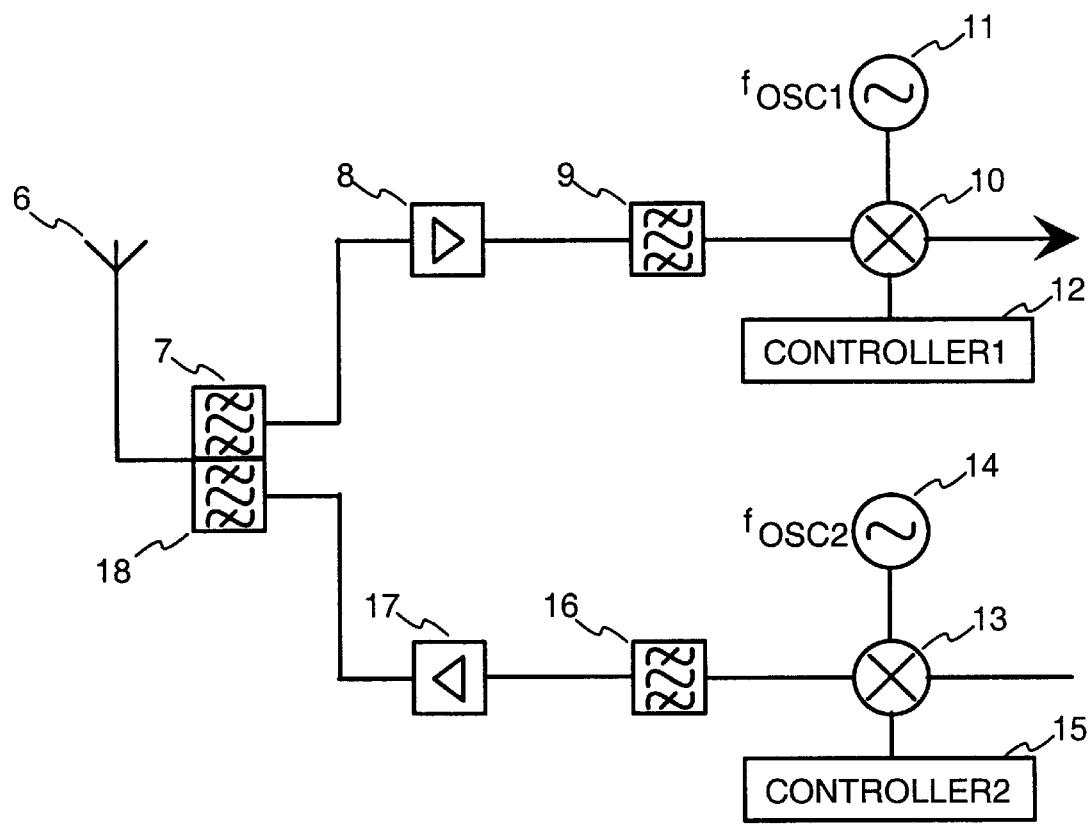
Figure 7:
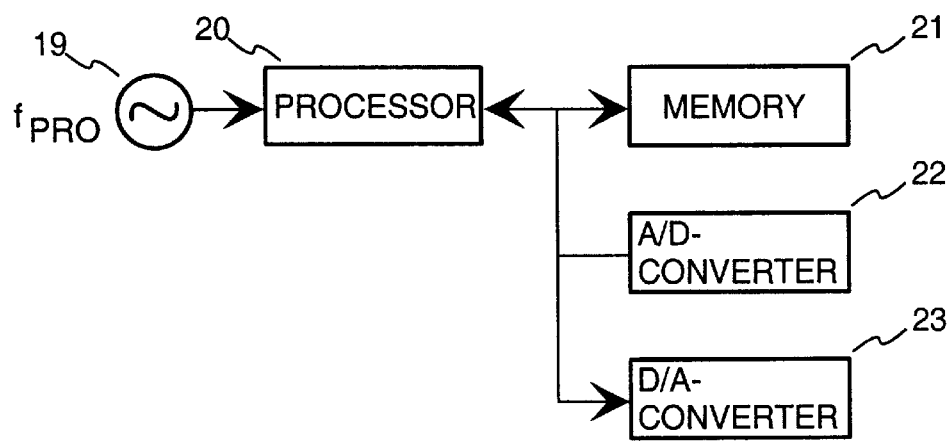

The invention will now be described in more detail with reference to the accompanying drawing wherein FIG. 1 shows in the form of circuit diagram a known Gilbert cell, FIG. 2 shows in the form of flow diagram a method according to the invention for adjusting the balance of a mixer, FIG. 3 shows in the form of circuit diagram a bias voltage adjustment block of a mixer according to the invention, FIG. 4 shows in the form of circuit diagram a mixer according to the invention, FIG. 5 shows in the form of circuit diagram a radio-frequency stage according to the invention, FIG. 6 shows in the form of block diagram essential parts of a transceiver according to the invention, and FIG. 7 shows in the form of block diagram a controller according to the invention for controlling an adjustment block.

DETAILED DESCRIPTION OF THE INVENTION

FIG. 1 shows a known Gilbert cell used for realizing integrated IF parts such as variable gain amplifiers and mixers. In a Gilbert cell two input voltages are multiplied into one output voltage, i.e. the voltage difference at the outputs is the product of the differences in the input voltages. A first voltage difference is coupled to terminals $V_{X+}$ and $V_{X-}$ wherefrom the voltages are taken to the bases of transistors Q3, Q4 and Q6, Q7, respectively. A second voltage difference is coupled to terminals $V_{Y+}$ and $V_{Y-}$ wherefrom the voltage is amplified by transistors Q5 and Q8. Transistors Q5 and Q8 are coupled through resistors $R_{E1}$ and $R_{E2}$ to a field effect transistor (FET) Q9 which is controlled by a bias voltage $V_{BIAS}$ and coupled to a negative operating voltage. Transistors Q3 and Q7 amplify a positive voltage difference $V_{X+}$ and $V_{X-}$, and the amplified voltage difference is coupled to outputs $V_{OUT+}$ and $V_{OUT-}$. The circuit mentioned above is coupled to a positive operating voltage through resistors $R_{L1}$ and $R_{L2}$. Transistors Q2 and Q4 amplify a negative voltage difference $V_{X+}$ and $V_{X-}$, and the amplified voltage difference is cross-coupled to outputs $V_{OUT+}$ and $V_{OUT-}$.

FIG. 2 shows in the form of flow diagram a balance adjustment method for a mixer according to the invention. First, possible previous bias voltages 1 are removed. Then, the balance error 2 of the mixer is determined by coupling a radio signal to the receiver inputs, thus causing a spurious signal in the mixer, which is then measured at the mixer outputs. Next, a bias voltage 3 correcting the balance error is set, preferably by feeding an inversely proportional CTRL byte corresponding to the error to the adjustment block by means of a digital controller. If the error-correcting bias voltage cannot be determined on the basis of the measurement result, a trial bias voltage is set. CTRL byte means a binary number that sets the control for the CTRL lines. The binary lines of the CTRL byte control the switching transistors in the adjustment block, so that $I_{BIAS}$ is changed and the voltages between the terminals of the bias resistors change. The potential of the operating point of the mixer's transistor input is adjusted according to the point between the bias resistors. In other words, the adjustment block forms a variable voltage across the resistor in the series connection when the adjustment is carried out by means of current. The adjustment block may also be implemented using a variable voltage source. The operational input signals of the transistors are alternating voltages conducted by a capacitive component. When the bias voltage that corrects or at least changes the balance error has been generated, it is checked whether the error correction was successful, i.e. whether the mixer is in balance 4. If not, operation returns to step 2 to determine the remaining error and change the bias voltages on the basis of that determination. If the setting of the bias reduced the balance error, the bias is increased, but if the balance error became bigger the bias is taken back towards zero or, if zero is reached, the bias is set on the second line of the input pair. Thus, bias voltage remains advantageously only on one of the lines of the input pair in the balanced state. When the balancing has succeeded, the data of the balancing controller are stored in memory and normal operation of the mixer is started 5.

FIG. 3 shows in a circuit diagram an adjustment block for the bias voltage of a mixer according to the invention. In the adjustment block, a current from a reference current source $I_{REF}$ flows via a transistor $Q_{REF}$ from the operating voltage VDD to ground. Current $I_{REF}$ is mirrored to a bias current circuit on the right. Current $I_{BIASB}$ through transistor $Q_{BIASB}$ constitutes the invariable fundamental part of bias current $I_{BIAS}$. Transistors Q1, Q2, . . . QN and Q1S, Q2S, . . . QNS make up N parallel series connections, and a sum current of $I_1, I_2, \ldots I_N$ through said series connections constitutes the variable part of bias current $I_{BIAS}$. Control lines CTRL 1, 2, . . . N control transistors Q1S, Q2S, . . . QNS serving as switches. Transistors Q1, Q2, . . . QN are mutually binarily weighted such that transistors Q1S, Q2S, . . . QNS, which are controlled by control lines CTRL 1, 2, . . . N and connected in series with said transistors, can raise current $I_{BIAS}$ by $2^N-1$ levels, which means the current gets $2^N$ values. Binary weighting of the currents is achieved e.g. by connecting transistors in parallel in such a way that Q1 comprises one transistor, Q2 comprises two transistors, etc. With field effect transistors (FET), the currents may also be set by selecting the channel widths. The currents are weighted preferably according to the following series: 1, 2, 4, 8, etc., i.e. $2^N$, where $N \geq 0$. For example, current $I_1$ is $I_{REF}/200$, current $I_2$ is $I_{REF}/100$ and $I_N$ is $I_{REF}/(200/2^{N-1})$.

Thus the imbalance caused by the tolerances of mixer components can be balanced using the variable part $I_1, I_2, \ldots I_N$ of current $I_{BIAS}$. Also, possible small imbalance of input signals can be balanced using the arrangement according to the invention. By changing the number of control lines and the current $I_{REF}$ of the reference current source it is possible to adapt the bias adjustment steps and range to various couplings.

FIG. 4 shows in a circuit diagram a mixer according to the invention. In the upper left corner of FIG. 4 there are four blocks depicted in FIG. 3 that generate the bias current $I_{BIAS}$ to control the bias voltage. The blocks are for local oscillator signal pair $V_{LO+}$ and $V_{LO-}$ and radio-frequency signal pair $V_{RF+}$ and $V_{RF-}$, which control through capacitive elements C1 and C2 as well as C3 and C4 the transistors Q10, Q11, Q13, Q14 and Q12, Q15. Blocks BLO+, BLO−, BRF+ and BRF− are used to produce currents and, thus, voltages to four parallel bias resistor series connections $R_{B1}$ and $R_{B2}$, $R_{B3}$ and $R_{B4}$, $R_{B5}$ and $R_{B6}$ as well as $R_{B7}$ and $R_{B8}$.

If the adjustment block current $I_{BIAS}$ is the same as the necessary base current of the corresponding transistor, e.g. a beta-compensated base current, a resistor connected to ground is not used with that adjustment block. For example, if adjustment blocks BRF+ and BRF− feed the base current of transistors Q15 and Q12, resistors $R_{B6}$ and $R_{B8}$ are left out and the corresponding bias voltage is set by adjusting the base current.

Load impedances $Z_{L3}, Z_{L4}$, transistors Q10, Q11, Q12, Q13, Q14, Q15 and emitter impedances $Z_{E3}, Z_{E4}$ constitute a known mixer the outputs of which give signals $V_{OUT+}$ and $V_{OUT-}$.

The balance is adjusted preferably as described above, but the most perfect balance is achieved by adjusting the bias voltages of the transistor pair's mutually corresponding transistors Q10, Q11 and Q13, Q14 separately. In other words, the controls of the transistors that get their control from the same line, such as Q10 and Q14, are separated from each other and the bias voltages of them both are adjusted individually.

FIG. 5 shows in a circuit diagram a radio-frequency amplifier stage according to the invention which also can be used to correct a mixer's balance error. In the upper left corner of FIG. 5 there are two blocks depicted in FIG. 3 that generate the bias current $I_{BIAS}$ to control the bias voltage. The blocks are for a radio-frequency signal pair $V_{RF+}$ and $V_{RF-}$ which control through capacitive elements C5 and C6 transistors Q16 and Q17. Blocks BRF+ and BRF- are used to produce currents and, thus, voltages to two parallel bias resistor series connections $R_{B9}$, $R_{B10}$ and $R_{B11}$, $R_{B12}$.

Load impedances $Z_{L5}$, $Z_{L6}$, transistors Q16, Q17, emitter impedances $Z_{E5}$, $Z_{E6}$ and current source $I_{DIFF}$ constitute a known radio-frequency amplifier stage.

The circuit according to FIG. 5 described above can also be used as local oscillator buffer. Then the balance error of the local oscillator port can be corrected by adjusting the buffer.

FIG. 6 shows in the form of block diagram essential parts of a transceiver according to the invention. The transceiver shares a common antenna 6 from which a signal is received and filtered by a bandpass filter 7 and amplified by an amplifier 8 and refiltered 9. Then the signal at the radio reception frequency is mixed to an intermediate frequency in a balanced mixer 10 according to the invention. A local oscillator 11 feeds the mixer 10 at the frequency of $f_{OSC1}$. The balance of the mixer 10 is adjusted by a controller 12. From the intermediate frequency on the reception continues in accordance with the prior art.

A signal to be transmitted is modulated at the local oscillator 14 frequency $f_{OSC2}$ by means of a modulator 13. The balance of the modulator 13 is adjusted by a controller 15. The modulated signal is bandpass-filtered by a filter 16 and amplified by an amplifier 17 and filtered again by a filter 18 and fed to the antenna 6. Otherwise the transmitter is preferably realized according to the prior art, and this document does not take a position on the use of balancing according to the invention in it.

FIG. 7 shows in a block diagram essential components of a controller of an adjustment block according to the invention. The processor 20 of a digital controller is stepped by an oscillator 19 at frequency $f_{PRO}$. The controller executes a program from memory 21, which preferably is both read only memory (ROM) and random access memory (RAM). Measurement data on the balance is obtained by means of an A/D converter 22. Bias voltages are controlled by a D/A converter 23 which preferably comprises an adjustment block according to FIG. 3 in which current is switched by means of digital binary control to adjust the bias voltages.

For example, let us consider a radio receiver the spurious response of which is to be reduced. The receiver is adjusted preferably only once before use. A test signal is coupled to the receiver input, and the interfering signal level is measured from the receiver output. The test signal is generated in such a way that it produces a spurious response to be minimized. A trial setting is chosen e.g. for the adjustment block BRF+ of the positive line of the RF input, and the interfering signal level is measured again. If the interference was reduced, an optimum setting is found for the adjustment block BRF+ by experimental bracketing, and if the interference got worse, the initial state is restored for the adjustment block BRF+ and a trial setting is chosen for the adjustment block BRF- of the negative line of the RF input and an optimum setting is found for it by experimental bracketing. The same experimental bracketing is also carried out for the local oscillator input by adjustment blocks BLO+ and BLO-. For a good result, both bracketing tunings are repeated. Thanks to the second tuning, a possible residual error, which is not noticed at the first time because it is hidden by an error in one of the input pairs, is corrected. Tuning data for the balance achieved through the minimization of spurious response are stored in the memory of the apparatus wherefrom they can be loaded by means of a micro-processor or digital signal processor (DSP) always on start-up. Fuses, micro-switches, programmable gate circuits and the like can also be used for the immediate control of the adjustment block.

Of course, the selection of the bias voltage initial setting line and the level of the setting can also be realized as a preferably calculatory value based on interference measurement data. Empirical knowledge can also be utilized when estimating the bias voltage value on the basis of the measurement result.

In digital mobile communications devices, such as mobile stations operating in GSM, PCN (Personal Communication Network), DAMPS (Digital Advanced Mobile Phone Standard) or CDMA (Code Division Multiple Access) networks, the received signal is converted digital. In these apparatus the method is advantageously applied in such a way that the spurious response is measured, adjusted as small as possible, and the settings are stored in memory by carrying out the necessary routines with a digital signal processor. Then the tuning is particularly fast as it is carried out by coupling a test signal to the antenna and executing a tuning program. The adjustment blocks are controlled by a microprocessor or preferably with the same digital signal processor. A serial or parallel bus is used for the control. For a serial bus an adjustment block needs a separate logic to control the transistors.

The balance can also be tuned without a test signal while the local oscillator is operating. To that end, a comparative element is coupled to the mixer outputs to compare the voltage difference of the output pair. Particularly the DC component is compared. Tuning is performed by decreasing the voltage difference to its minimum value. However, because of bias voltages in the comparative element itself, the inputs of the comparative element must switch places and the comparison has to be repeated. The average of the tunings gives a result which is as accurate as possible. However, this tuning result is not as accurate as the one achieved using a test signal. If this type of tuning is accurate enough for the application, the tuning can be carried out automatically with a digital signal processor.

The principles according to the invention can also be utilized in the balancing of passive mixers.

The exemplary adjustment block was here realized by field effect transistors but the circuit can also be realized using bipolar transistors, for example.

The invention is not limited to the exemplary embodiments described above but many modifications are possible within the scope of the inventional idea defined by the claims set forth below.

What is claimed is:

1. A method for attenuating spurious signals in at least one of a transmitter and a receiver in which radio signals are mixed to a second frequency, said method comprising balancing the mixing by adjusting at least one of the bias voltages and currents in transistors of the mixer circuit, and said adjusting step comprises tuning the receiver by measuring the balance from the receiver outputs and empirically adjusting at least one of the bias voltages and currents on the basis of measurements.

2. The method of claim 1, wherein at least one of the bias voltages and currents are adjusted in an input circuit of a radio-frequency signal.

3. The method of claim 1, wherein at least one of the bias voltages and currents are adjusted in an input circuit of a local oscillator.

4. The method of claim 1, wherein at least one of the bias voltages and currents are adjusted separately for both transistors of a transistor pair of a signal line in the mixer circuit.

5. The method of claim 1, wherein the adjustment of at least one of the bias voltages and currents is performed using a digital-to-analog converter to adjust current for the signal line across parallel resistors.

6. A receiver comprising a mixer circuit for mixing radio signals to a second frequency, means for attenuating spurious signals when receiving radio signals, and balance adjustment means in the mixer circuit to adjust the circuit's balance by adjusting at least one of the bias voltages and currents in transistors of the mixer circuit.

7. The receiver of claim 6, wherein the adjustment means comprises an input circuit for a radio-frequency signal to adjust at least one of the bias voltages and currents of an adjustment circuit.

8. The receiver of claim 6, wherein the adjustment means comprises a local oscillator input circuit to adjust at least one of the bias voltages and currents of an adjustment circuit.

9. The receiver of claim 6, wherein the adjustment means comprises an adjustment circuit separately for both transistors of a transistor pair, of a signal line of the mixer circuit to adjust at least one of the bias voltages and currents.

10. The receiver of claim 6, wherein the adjustment means comprises a digital-to-analog converter to adjust at least one of the bias voltages and currents with a digital controller.

11. The receiver of claim 6, wherein it further comprises an A/D converter to measure the balance, a D/A converter to adjust at least one of the bias voltages and currents, and an oscillator, a processor and memory to carry out balance measurement routines as well as at least one of the bias voltage and current adjustment routines.

* * * * *